(12) United States Patent
Mantese et al.

(10) Patent No.: US 11,424,742 B2
(45) Date of Patent: Aug. 23, 2022

(54) SUPERCONDUCTING SWITCHING DEVICES AND PROCESSES OF FORMING

(71) Applicant: Ferro Domain, LLC, Ellington, CT (US)

(72) Inventors: John J. Mantese, Ellington, CT (US); Joseph V. Mantese, Ellington, CT (US)

(73) Assignee: Ferro Domain, LLC., Ellington, CT (US)

( * ) Notice: Subject to any disclaimer, the term of this patent is extended or adjusted under 35 U.S.C. 154(b) by 0 days.

(21) Appl. No.: 17/382,484

(22) Filed: Jul. 22, 2021

(65) Prior Publication Data

US 2022/0224332 A1   Jul. 14, 2022

Related U.S. Application Data

(60) Provisional application No. 63/055,568, filed on Jul. 23, 2020.

(51) Int. Cl.
*H03K 17/92* (2006.01)

(52) U.S. Cl.
CPC .................................. *H03K 17/92* (2013.01)

(58) Field of Classification Search
CPC ...................................................... H03K 17/92
USPC ............................................................ 327/210
See application file for complete search history.

(56) References Cited

U.S. PATENT DOCUMENTS

2021/0336120 A1*  10/2021  Mantese ............. H01L 39/2403

* cited by examiner

*Primary Examiner* — Tomi Skibinski
(74) *Attorney, Agent, or Firm* — Hartman Global IP Law; Gary M. Hartman; Domenica N. S. Hartman

(57) ABSTRACT

Superconducting switching devices of electrically-polarizable ferroelectric materials and electrically conductive materials with control electrodes. Superconducting states of the superconducting switching devices are determined by polarization states of the electrically-polarizable ferroelectric materials and voltages applied to the control electrodes.

17 Claims, 8 Drawing Sheets

SUPERCONDUCTING SWITCHING DEVICES AND PROCESSES OF FORMING

CROSS-REFERENCE TO RELATED APPLICATIONS

This application claims the benefit of U.S. Provisional Application No. 63/055,568, filed Jul. 23, 2020, the contents of which are incorporated herein by reference.

BACKGROUND

The present invention generally relates to superconducting switching devices and methods for their fabrication. The invention particularly relates to superconducting switching devices formed as a cooperative phenomenon between coupled charge carriers confined within an electrically conductive material interfaced with one or more regions of an electrically-polarizable ferroelectric material. The superconducting state can be controlled through the application of a control voltage.

Superconductivity is a naturally occurring phenomenon manifested by near-zero electrical resistance and the occurrence of spontaneous diamagnetism below a critical transition temperature, $T_c$.

Superconducting materials (superconductors) have a number of practical applications, including but not limited to the carrying of current without resistive losses, high sensitivity magnetometers, quantum sensing, and as logic elements—qubits in quantum computing systems.

Superconductors with critical transitions above liquid nitrogen temperature (LNT, 77K) are of special interest as they then can be used with liquid-based cooling, greatly simplifying their implementation as devices, their packaging, and their maintenance. Materials with 77K superconducting transitions or above are of particular interest as they provide the critical elements for newer classes of quantum inspired sensors and devices that can be used with either liquid nitrogen or thermoelectric based cooling.

Superconducting devices capable of being switched between a superconducting state and a non-superconducting state and vice versa, are especially useful for sensors, logic elements, and systems where the control of current is desirable.

BRIEF DESCRIPTION

The present application discloses superconducting switching devices comprising combinations of electrically conductive materials, dielectric layers, and electrically-polarizable ferroelectric materials with control electrodes for switching the superconducting switching devices between a superconducting state and a non-superconducting state or from a non-superconducting state to a superconducting state.

According to one aspect of the invention, a superconducting switching device includes an electrically-polarizable ferroelectric material having a ferroelectric polarization, and an electrically conductive material that provides charge carriers confined within the electrically conductive material and adjacent to the electrically-polarizable ferroelectric material. The electrically-polarizable ferroelectric material is not required to have the same ferroelectric polarization throughout, and may comprise or consist of a single crystal of uniform polarization, multiple electrically-polarizable domains, or even individual ferroelectric unit cells.

According to another aspect of the invention, the superconducting switching device further comprises control electrodes of electrically conductive materials, including a first control electrode adjacent the electrically conductive material and a second control electrode adjacent the electrically-polarizable ferroelectric material. At least a first dielectric layer is between the first control electrode and the electrically conductive material. Optionally, a second dielectric layer is between the second control electrode and the electrically-polarizable ferroelectric material.

According to another aspect of the invention, a voltage can be applied across the control electrodes to induce a change in the superconducting state of the superconducting switching device, i.e., between superconducting and non-superconducting states.

According to another aspect of the invention, a method of producing superconducting switching devices includes combining an electrically conductive material, an electrically-polarizable ferroelectric material, a first control electrode, a first dielectric layer, and a second control electrode by powder mixing, ceramic layer casting, melt forming, sputtering, atomic layer deposition, physical vapor deposition, molecular beam epitaxy, atomic layer deposition, electroplating, chemical vapor deposition, or co-sintering, to yield a layered or mixture composite structure.

Technical aspects of superconducting switching devices and processes having features as described above preferably include the ability of the superconducting switching devices to utilize the electrical polarizability nature of some materials to induce a superconducting state within electrically conductive materials below or above liquid nitrogen temperature and even approaching room temperature.

The switching devices may be fabricated as "normally-on," "normally-off," or "mixed" by selection of the direction of the ferroelectric polarization state of the electrically-polarizable ferroelectric material or by changing the free type or amount of charge accumulation at the surface of the electrically-polarizable ferroelectric material.

The switching devices may be changed from a "normally-on," or "normally-off," or "mixed" superconducting state to another superconducting state or to a non-superconducting state by changing the ferroelectric polarization state of the electrically-polarizable ferroelectric material or by changing the free type or amount of charge accumulation at the surface of the electrically-polarizable ferroelectric material through the application of a control voltage.

Other aspects and advantages of this invention will be appreciated from the following detailed description.

DETAILED DESCRIPTION

Figure 1:
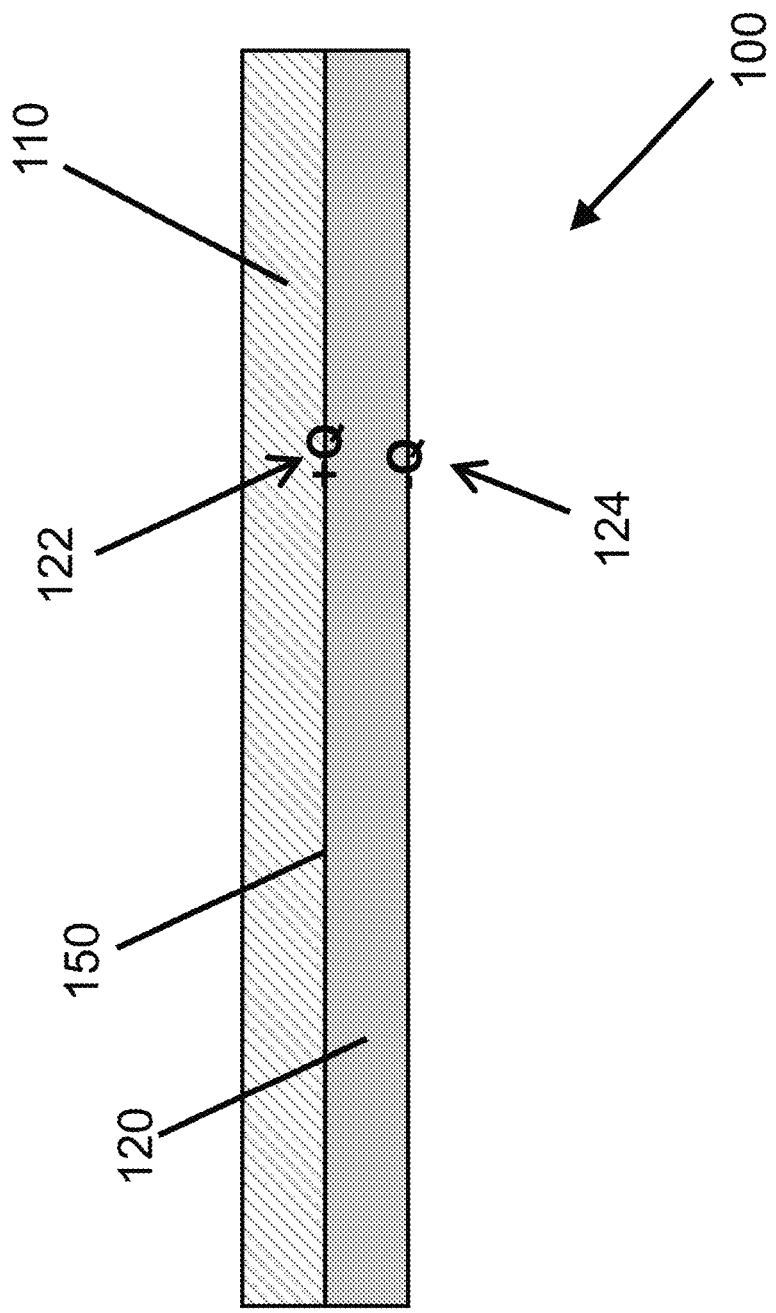
FIG. 1 schematically represents a superconducting device comprising a layer of an electrically conductive material in contact with a layer of an electrically-polarizable ferroelectric material.

The intended purpose of the following detailed description of the invention and the phraseology and terminology employed therein is to describe what is shown in the drawings, which include the depiction of one or more nonlimiting embodiments of the invention, and to describe certain but not all aspects of what is depicted in the drawings, including the embodiment(s) depicted in the drawings. The following detailed description also identifies certain but not all alternatives of the embodiment(s) depicted in the drawings. Therefore, the appended claims, and not the detailed description, are intended to particularly point out subject matter regarded as the invention, including certain but not necessarily all of the aspects and alternatives described in the detailed description.

Superconducting materials (superconductors) and superconducting switching devices are described below that comprise electrically-polarizable ferroelectric materials and electrically conductive materials that provides charge carriers confined within the electrically conductive material adjacent the electrically-polarizable ferroelectric material. Charge coupling spontaneously arises within the electrically conductive material as a result of ferroelectric polarization, and coupled charge carriers are confined in two-dimensional (2D) or one dimensional (1D) regions of the electrically conductive material adjacent to electrically polar regions of the electrically-polarizable ferroelectric material. Electrons are attracted to positive regions of ferroelectric polarization in the electrically-polarizable ferroelectric material, while holes are attracted to negative regions of ferroelectric polarization in the electrically-polarizable ferroelectric material. The electrically-polarizable ferroelectric material may have the same (uniform) ferroelectric polarization throughout (e.g., as a ferroelectric single crystal thin film or bulk ceramic substrate that spans across the entire structure), or its ferroelectric polarization may be relegated to one or more regions (domains) as small as a single ferroelectric unit cell. A superconducting state is achieved in the devices when the absolute magnitude of the binding energy of a pair of charge carriers to the ferroelectric polarization charge exceeds the repulsive energy between the charge carriers and the average kinetic energy of the carrier pairs. Superconducting temperatures exceeding liquid nitrogen temperature (77K) are thus possible.

FIG. 1 schematically represents a superconducting device 100 comprising a conductor 110 formed by a layer of an electrically conductive material. The conductor 110 contacts a ferroelectric layer 120 of an electrically-polarizable ferroelectric material. The ferroelectric layer 120 creates a positively-charged ferroelectric polarization 122 at a surface thereof located at its interface 150 with the conductor 110, and a negatively-charged ferroelectric polarization 124 at its surface opposite the conductor 110. Without loss of generality, the charges of the ferroelectric polarizations 122 and 124 may be interchanged and the conductor 110 and ferroelectric layer 120 may be interchanged. Without loss of generality, the device 100 may represent a portion of the material, a domain, or even a single ferroelectric unit cell.

FIGS. 2A through 5 schematically represent superconducting switching devices in accordance with embodiments of this invention. In these figures, consistent reference numbers are used to identify the same or functionally related/equivalent elements, but with a numerical prefix (1, 2, 3, etc.) added to distinguish the particular embodiment from the embodiment of FIG. 1.

Figure 2A:
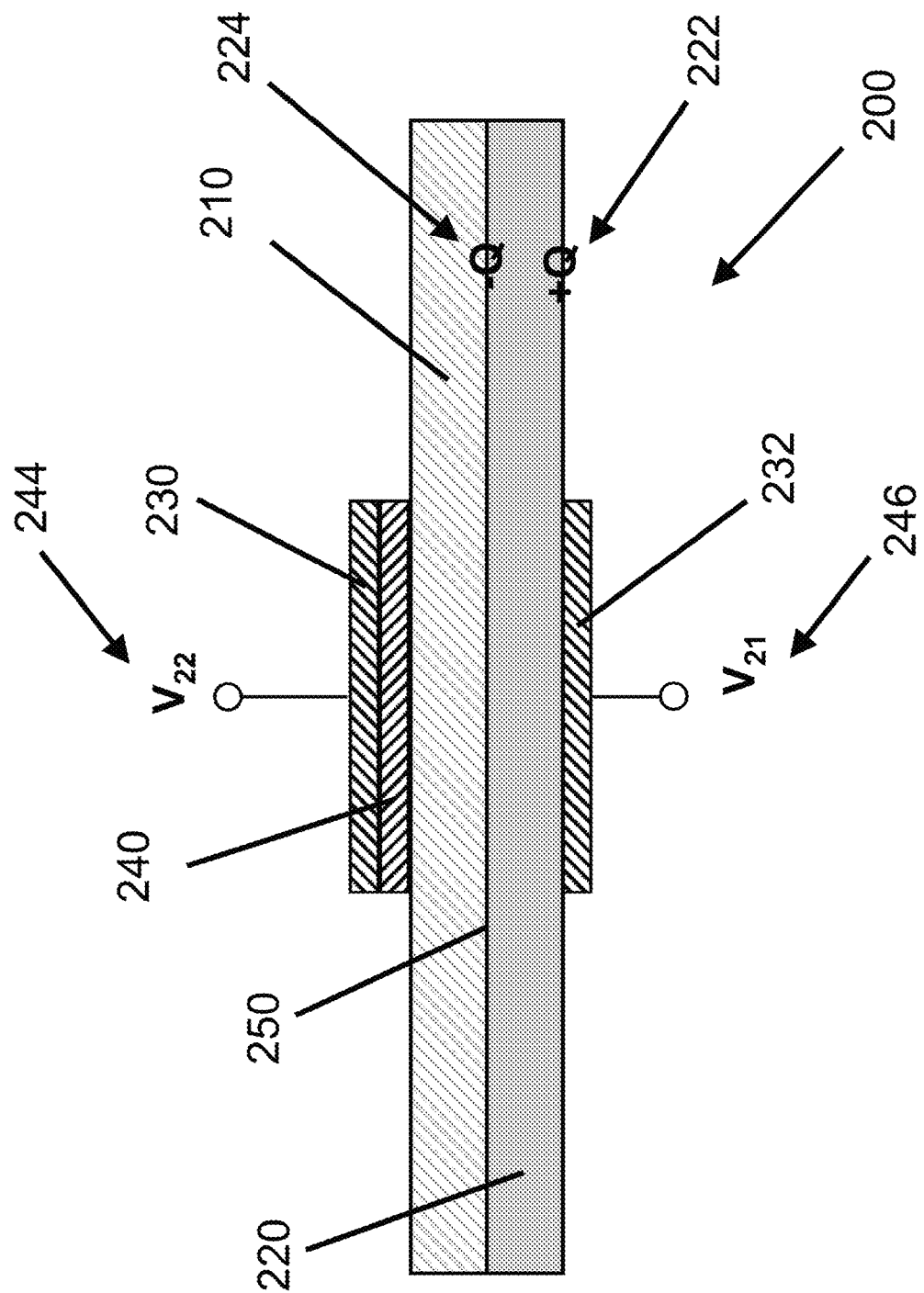
FIGS. 2A and 2B schematically represent nonlimiting embodiments of superconducting switching devices, each comprising a layer of an electrically conductive material in contact with a layer of an electrically-polarizable ferroelectric material, control electrodes, and one or more dielectric layers that in combination enable active switching of the superconducting states of the superconducting switching devices.

FIG. 2A schematically represents a superconducting switching device 200 with control electrodes 230 and 232 formed of electrically conductive materials. The control electrodes 230 and 232 are adapted for switching the superconducting state of the conductor 210 by applying voltages across the conductor 210. The ferroelectric layer 220 has ferroelectric polarizations 222 and 224 at opposite surfaces thereof whose charges are opposite that of the ferroelectric polarizations 122 and 124 of the device 100 of FIG. 1. The values of the polarizations 222 and 224 depend on how the electrically-polarizable ferroelectric material of the ferroelectric layer 220 is "poled" by the control electrodes 230 and 232. The conductor 210 can either be superconducting or non-superconducting depending on the poled state of the ferroelectric layer 220. A dielectric layer 240 electrically insulates the control electrode 230 from the conductor 210, whereas the control electrode 232 is shown as contacting the ferroelectric layer 220 at its surface opposite the conductor 210. The switching state of the conductor 210 can be changed by the application of voltages 244 and 246 at the control electrodes 230 and 232, respectively, to induce a superconducting state in the event that the conductor 210 is non-superconducting or arrest a superconducting state in the event that the conductor 210 is superconducting.

Figure 2B:
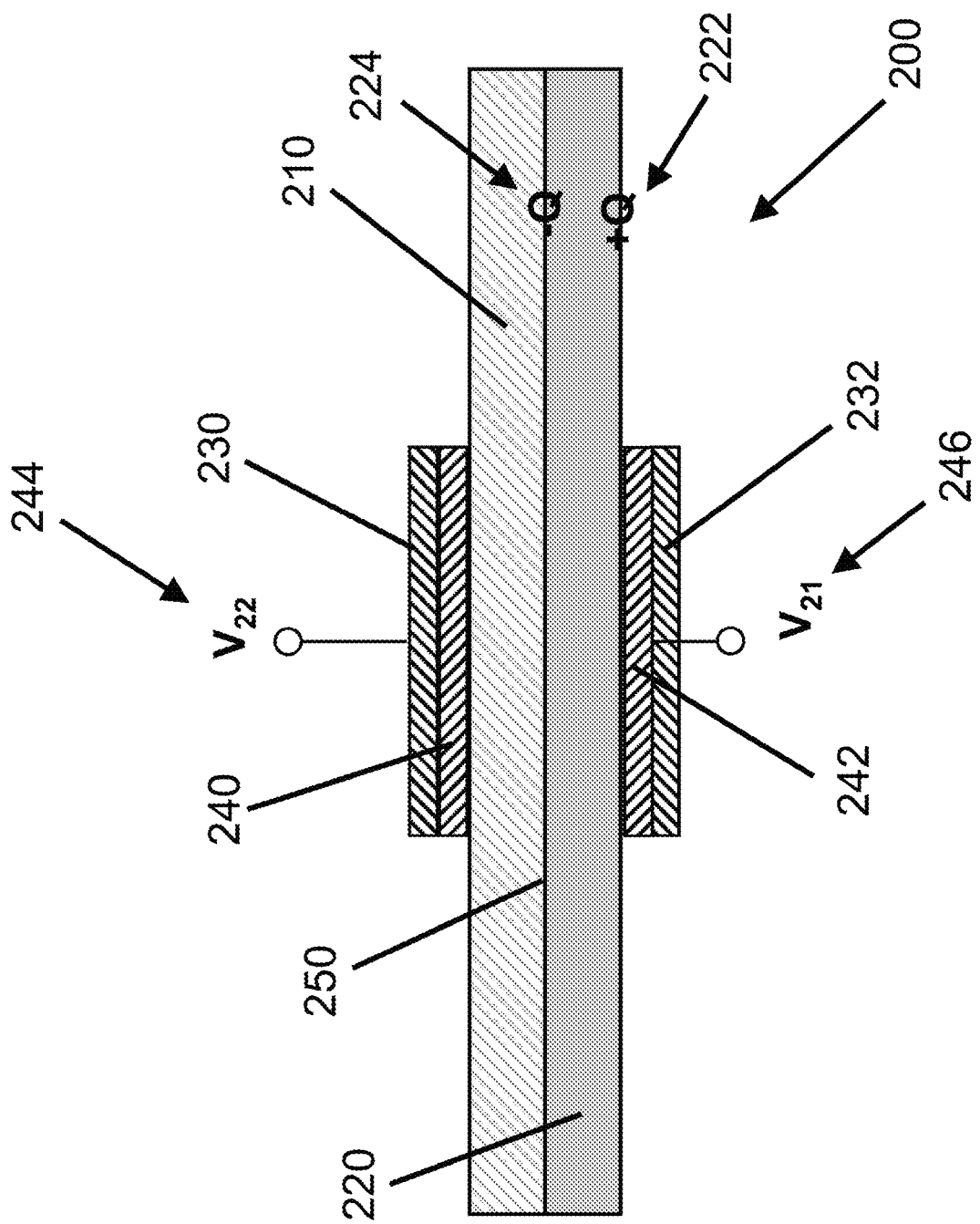

FIG. 2B schematically represents the superconducting switching device 200 of FIG. 2A with an additional dielectric layer 242 insulating the control electrode 232 from the ferroelectric layer 220. The additional dielectric layer 242 inhibits charge leakage from the ferroelectric layer, 220, which would otherwise compromise the superconducting state of the conductor 210.

Figure 3A:
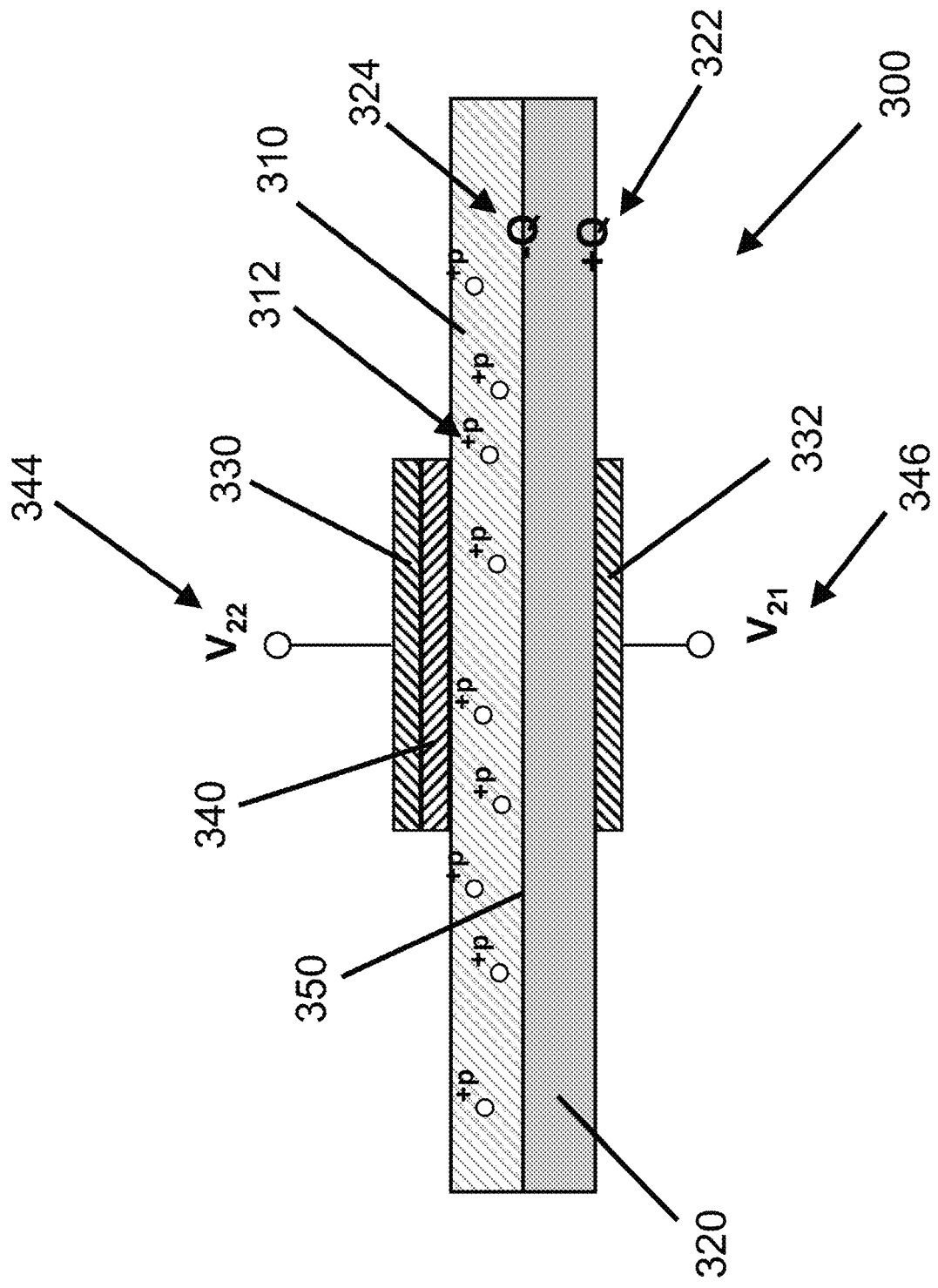
FIG. 3A schematically represents a nonlimiting embodiment of a superconducting switching device equipped with a p-type electrically conductive material, configured to have a "normally-on" superconducting state, and control electrodes to arrest the superconducting state.

FIG. 3A schematically represents a superconducting switching device 300 that is similar to the superconducting switching device 200 of FIG. 2A, but with the conductor 310 being doped p-type with hole carriers 312. The superconducting switching device 300 is shown here as a "normally-on" device, due to the hole carriers 312 being adjacent the negative polarization charge 324. As used herein, "normally-on" means that the device 300 is superconducting by default. The superconducting switching device 300 may be switched to be "normally-off" either by switching the locations of the positively-charged and negatively-charged polarizations 322 and 324 at the ferroelectric layer 320 or by applying voltages 344 and 346 at the control electrodes 330 and 332, respectively. The control electrode 330 is separated from the p-type conductor 310 by the dielectric layer 340, whereas the control electrode 332 contacts the ferroelectric layer 320.

Figure 3B:
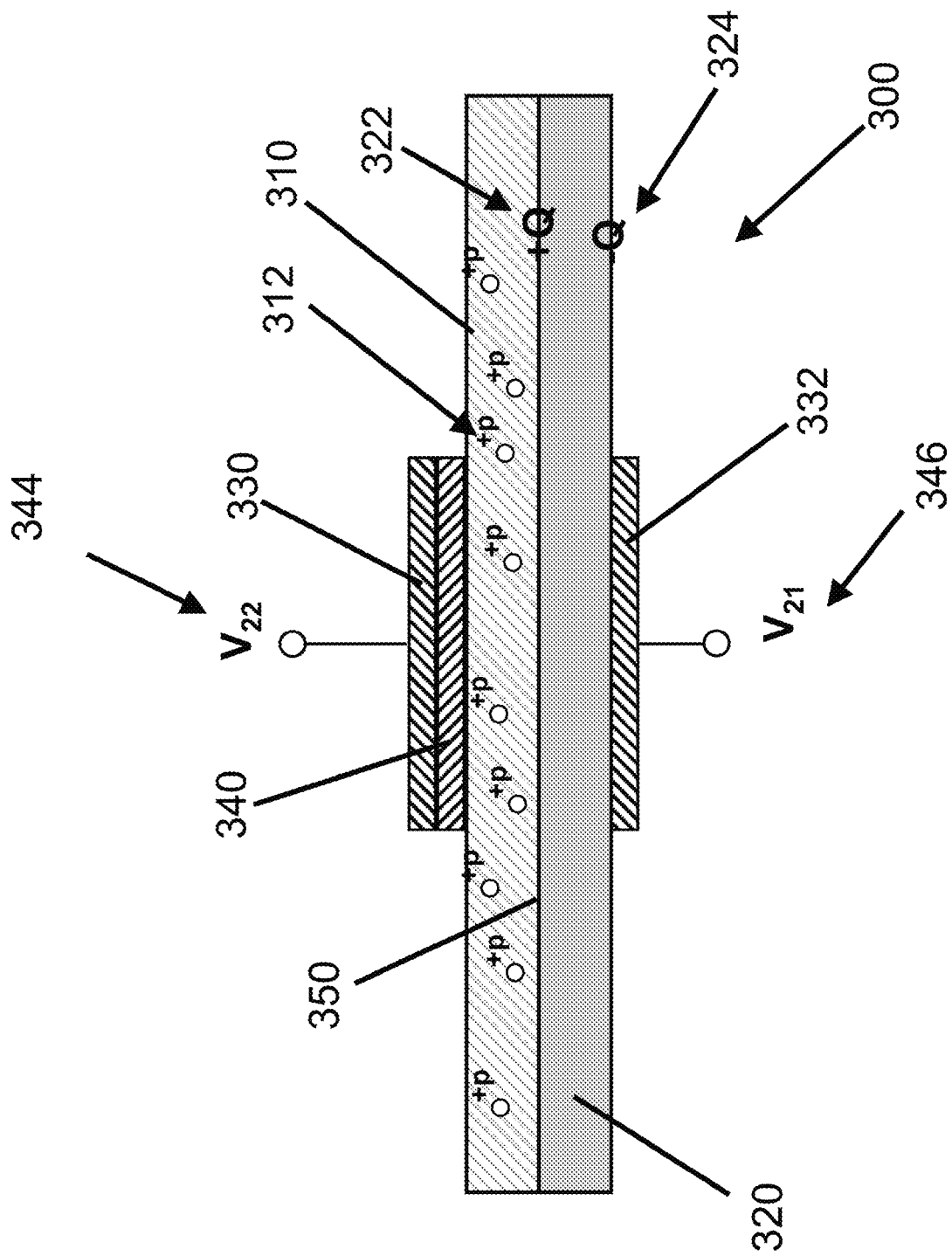
FIG. 3B schematically represents a nonlimiting embodiment of a superconducting switching device equipped with a p-type electrically conductive material, configured to have a "normally-off" superconducting state, and control electrodes to induce a superconducting state FIG. 4A schematically represents a nonlimiting embodiment of a superconducting switching device equipped with an n-type electrically conductive material, configured to have a "normally-on" superconducting state, and control electrodes to arrest the superconducting state.

FIG. 3B schematically represents the superconducting switching device 300 of FIG. 3A as a "normally-off" device as a result of the locations of the positively-charged and negatively-charged polarizations 322 and 324 being opposite that of the device 300 of FIG. 3A. As used herein, "normally-off" means that the device 300 is non-superconducting by default. The superconducting switching device 300 may be switched to be "normally-on" either by switching the locations of the positively-charged and negatively-charged polarizations 322 and 324 at the ferroelectric layer 320 or by applying voltages 344 and 346 at the control electrodes 330 and 332, respectively.

Figure 4A:
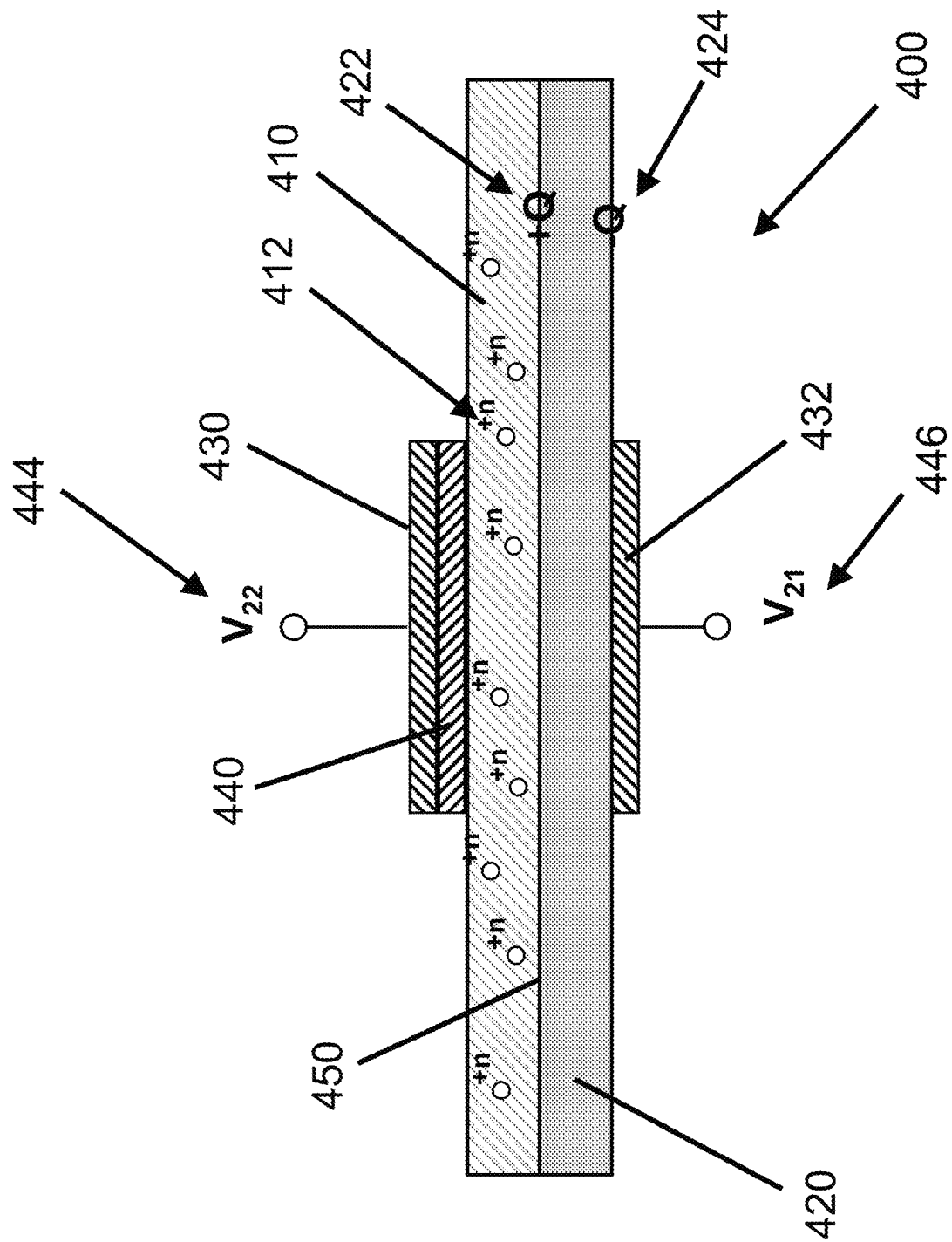
FIG. 4B schematically represents a nonlimiting embodiment of a superconducting switching equipped with an n-type electrically conductive material, configured to have a "normally-off" superconducting state, and control electrodes to induce a superconducting state.

FIG. 4A schematically represents a superconducting switching device 400 that is similar to the superconducting switching device 200 of FIG. 2A, but with the conductor 410 being doped n-type with electron carriers 412. . The superconducting switching device 400 is shown here as a "normally-on" device. The superconducting switching device 400 may be switched to be "normally-off" either by switching the locations of the positively-charged and negatively-charged polarizations 422 and 424 at the ferroelectric layer 420 or by applying voltages 444 and 446 at the control electrodes 430 and 432, respectively.

Figure 4B:
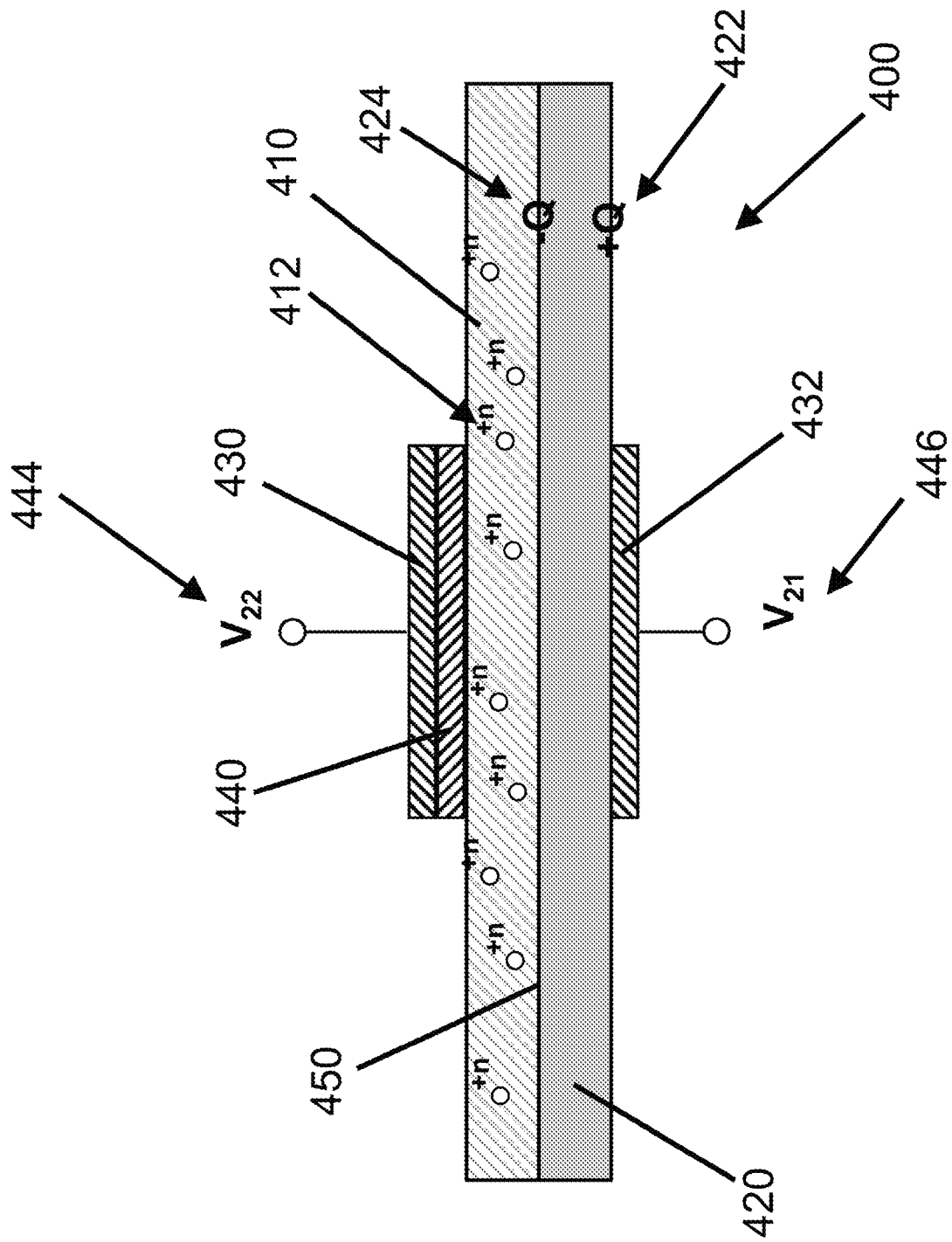

FIG. 4B schematically represents the superconducting switching device 400 of FIG. 4A as a "normally-off" device as a result of the charges of the polarizations 422 and 424 being opposite that of the polarizations 422 and 424 of the device 400 of FIG. 4A. The superconducting switching device 400 may be switched to be "normally-on" either by switching the locations of the positively-charged and negatively-charged polarizations 422 and 424 at the ferroelectric layer 420 or by applying voltages 344 and 346 at the control electrodes 330 and 332, respectively.

Figure 5:
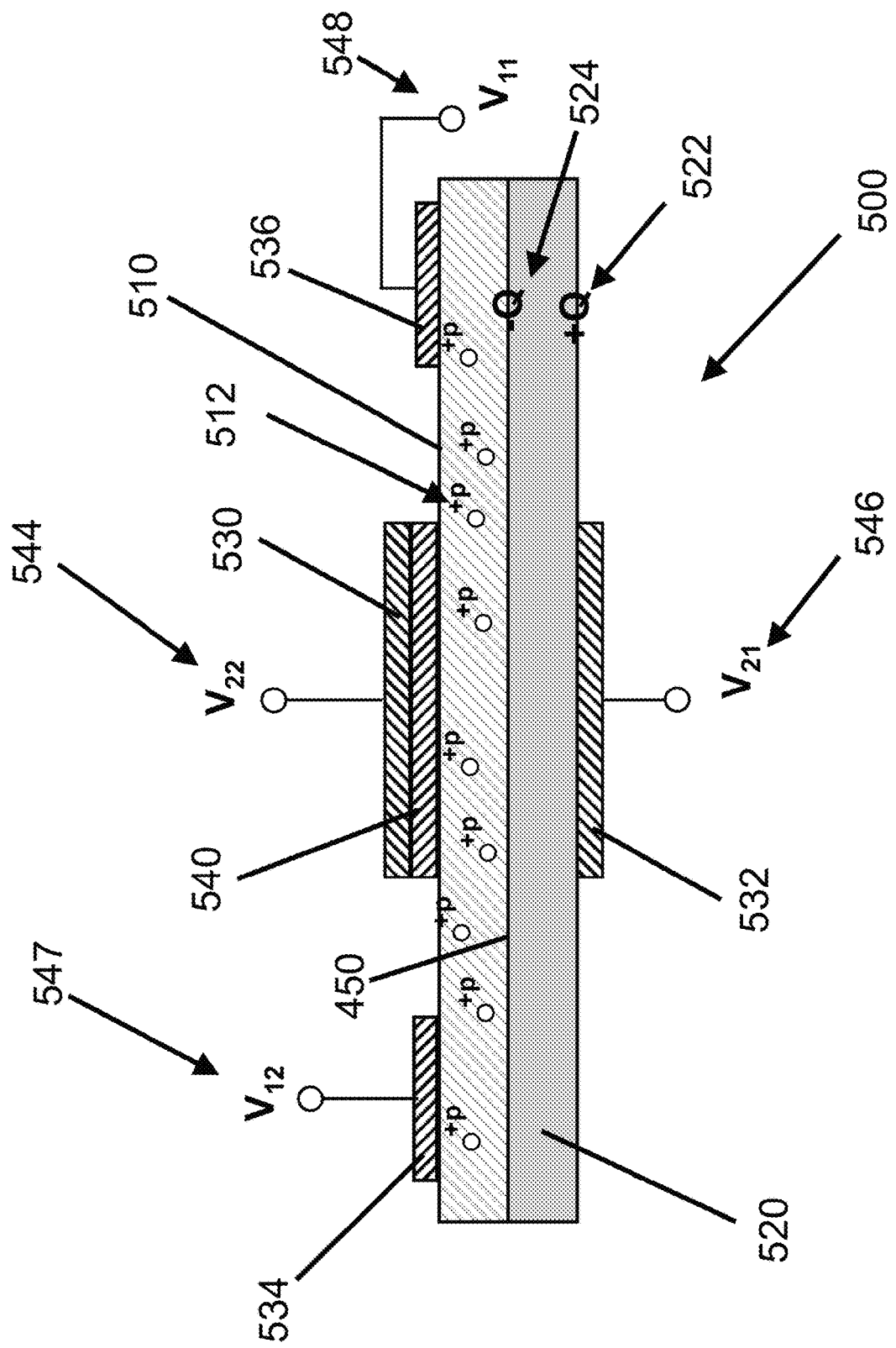
FIG. 5 schematically represents a nonlimiting embodiment of a superconducting switching device equipped with a p-type electrically conductive material, configured to have a "normally-on" superconducting state, control electrodes to arrest the superconducting state, and a second set of electrodes that can be used to apply voltages to interrogate the state, whether superconducting or non-superconducting, of the superconducting switching device.

FIG. 5 schematically represents a superconducting switching device 500 that is similar to the superconducting switching device 300 of FIG. 3B, but shown as a "normally-on" device. The superconducting switching device 500 may be switched to be "normally-off" either by switching the locations of the positively-charged and negatively-charged polarizations 522 and 524 at the ferroelectric layer 520 or by applying voltages 544 and 546 at the control electrodes 530 and 532, respectively (which may also be referred to as gates or gate electrodes). Though FIG. 5 shows a p-type conductor, an n-type conductor may be substituted with the polarizations reversed.

FIG. 5 represents a second set of electrodes 534 and 536 that can be used to apply voltages 547 and 548, respectively, along the conductor 510 to interrogate the superconducting state of the device 500, i.e., whether superconducting or non-superconducting. The interrogation of the superconducting state of the device 500 is achieved by injecting a current into the electrode 534 (operating as a "source") and extracting current from the electrode 536 (operating as a "drain"), or by injecting current into the electrode 536 (operating as a source) and extracting current from the electrode 534 (operating as a drain). The superconducting state of the device 500 can thus be assessed by a decrease in current when the device 500 is non-superconducting. The difference between the superconducting and non-superconducting state of the device 500 can be referred to as a binary logic state, "1" or "0" (the designation of the "1" and "0" state being arbitrary). Each voltage 547 and 548 must be sufficient to drive the interface charge, −Q, to less than the binding energy of the carriers, +p and +p, created by the surface charge.

While the invention has been described in terms of particular embodiments and investigations, it should be apparent that alternatives could be adopted by one skilled in the art. For example, superconducting materials and devices and their components could differ in appearance and construction from the embodiments described herein and shown in the drawings, process parameters could be modified, and appropriate materials could be substituted for those noted. As such, it should be understood that the above detailed description is intended to describe the particular embodiments represented in the drawings and certain but not necessarily all features and aspects thereof, and to identify certain but not necessarily all alternatives to the represented embodiments and described features and aspects. As a nonlimiting example, the invention encompasses additional or alternative embodiments in which one or more features or aspects of a particular embodiment could be eliminated or two or more features or aspects of different embodiments could be combined. Accordingly, it should be understood that the invention is not necessarily limited to any embodiment described herein or illustrated in the drawings, and the phraseology and terminology employed above are for the purpose of describing the disclosed embodiments and investigations and do not necessarily serve as limitations to the scope of the invention. Therefore, the scope of the invention is to be limited only by the following claims.

What is claimed is:

1. A superconducting switching device comprising:
   an electrically-polarizable ferroelectric material having a ferroelectric polarization;
   an electrically conductive material interfacing with the electrically-polarizable ferroelectric material, the electrically conductive material providing coupled charge carriers confined between the electrically conductive material and the electrically-polarizable ferroelectric material;
   a first dielectric layer adjacent to the electrically conductive material;
   a first control electrode adjacent the first dielectric layer such that the first dielectric layer is between the first control electrode and the electrically conductive material;
   a second control electrode adjacent the electrically-polarizable ferroelectric material at a surface thereof opposite the first control electrode;
   wherein the superconducting switching device has a superconducting state.

2. The superconducting switching device of claim 1, further comprising a second dielectric layer between the second control electrode and the electrically-polarizable ferroelectric material.

3. The superconducting switching device of claim 2, wherein the ferroelectric polarization of the electrically-polarizable ferroelectric material causes the superconducting switching device to be a "normally-on" device.

4. The superconducting switching device of claim 2, wherein the ferroelectric polarization of the ferroelectric yields a "normally-off" device.

5. The superconducting switching device of claim 2, wherein the superconducting switching device is configured such that the superconducting state may be induced.

6. The superconducting switching device of claim 2, wherein the superconducting switching device is configured such that the superconducting state may be arrested.

7. The superconducting switching device of claim 2, wherein the superconducting switching device is configured such that the superconducting state of the superconducting switching device can be changed from "normally-on" to "normally-off".

8. The superconducting switching device of claim 2, wherein the superconducting switching device is configured such that the superconducting state of the superconducting switching device can be changed from "normally-off" to "normally-on".

9. The superconducting switching device of claim 2, further comprising a set of electrodes configured to apply voltages along the electrically conductive material to interrogate the state, whether superconducting or non-superconducting, of the superconducting switching device.

10. The superconducting switching device of claim 1, wherein the ferroelectric polarization of the electrically-polarizable ferroelectric material causes the superconducting switching device to be a "normally-on" device.

11. The superconducting switching device of claim 1, wherein the ferroelectric polarization of the ferroelectric yields a "normally-off" device.

12. The superconducting switching device of claim 1, wherein the superconducting switching device is configured such that the superconducting state may be induced.

13. The superconducting switching device of claim 1, wherein the superconducting switching device is configured such that the superconducting state may be arrested.

14. The superconducting switching device of claim 1, wherein the superconducting switching device is configured such that the superconducting state of the superconducting switching device can be changed from "normally-on" to "normally-off".

15. The superconducting switching device of claim 1, wherein the superconducting switching device is configured such that the superconducting state of the superconducting switching device can be changed from "normally-off" to "normally-on".

16. The superconducting switching device of claim 1, further comprising a set of electrodes configured to apply voltages along the electrically conductive material to interrogate the state, whether superconducting or non-superconducting, of the superconducting switching device.

17. A method of operating a superconducting switching device having an electrically-polarizable ferroelectric material and an electrically conductive material interfacing with the electrically-polarizable ferroelectric material, the electrically-polarizable ferroelectric material having a ferroelectric polarization, the electrically conductive material providing coupled charge carriers confined between the electrically conductive material and the electrically-polarizable ferroelectric material, the method comprising:
inducing or arresting a superconducting state in the superconducting switching device by applying a first control voltage to the superconducting switching device; and
changing the superconducting state of the superconducting switching device from "normally-off" to "normally-on" or changing the superconducting state of the superconducting switching device from "normally-on" to "normally-off" by changing the ferroelectric polarization state of the electrically-polarizable ferroelectric material or applying a second control voltage to the superconducting switching device.

\* \* \* \* \*